(12) United States Patent
Rose et al.

(10) Patent No.: US 7,425,909 B2
(45) Date of Patent: Sep. 16, 2008

(54) LOW-NOISE PROGRAMMABLE CURRENT SOURCE

(75) Inventors: Steven C. Rose, Beverly, MA (US); Richard E. Schreier, Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/496,568

(22) Filed: Jul. 31, 2006

(65) Prior Publication Data

US 2008/0024343 A1 Jan. 31, 2008

(51) Int. Cl.
*H03M 1/00* (2006.01)
(52) U.S. Cl. .................. 341/135; 341/136; 341/144
(58) Field of Classification Search ............ 341/135, 341/136
See application file for complete search history.

(56) References Cited

U.S. PATENT DOCUMENTS

| | | | | |
|---|---|---|---|---|
| 6,507,304 | B1* | 1/2003 | Lorenz ................. | 341/144 |
| 6,741,195 | B1* | 5/2004 | Cho .................... | 341/136 |
| 6,917,316 | B2* | 7/2005 | Blackburn ............ | 341/118 |
| 6,922,162 | B2* | 7/2005 | Horsky et al. ........ | 341/144 |
| 6,958,719 | B2* | 10/2005 | Moon ................... | 341/135 |
| 7,012,597 | B2* | 3/2006 | Kasai .................. | 345/204 |
| 7,019,676 | B2* | 3/2006 | Ikoma et al. ......... | 341/144 |
| 7,116,183 | B2* | 10/2006 | Wu ..................... | 331/176 |
| 7,292,172 | B2* | 11/2007 | Matsumoto et al. ... | 341/144 |
| 2006/0103475 | A1* | 5/2006 | Hofer .................. | 331/16 |
| 2006/0145771 | A1* | 7/2006 | Strange ............... | 331/16 |
| 2006/0226916 | A1* | 10/2006 | Florescu et al. ...... | 331/16 |

OTHER PUBLICATIONS

A.D. Berny et al., "*A 1.8 GHz LC VCO With 1.3-GHz Tuning Range and Digital Amplitute Calibration*," IEEE J. Solid-State Circuits, vol. 40, No. 4, pp. 909-917, Apr. 2005.
A. Jerng, et al., "*The Impact of Device Type and Sizing on Phase Noise Mechanisms*," IEEE J. Solid-State Circuits, vol. 40, No. 2, pp. 360-369, Feb. 2005.

* cited by examiner

*Primary Examiner*—Khai M Nguyen
(74) *Attorney, Agent, or Firm*—Iandiorio Teska & Coleman

(57) ABSTRACT

A low-noise programmable current source includes an output digital to analog converter for providing an output load current; and a control circuit, responsive to an input defining a predetermined load current for generating, for the digital to analog converter, a control word and a control voltage; the control word and the control voltage drive the digital to analog converter to produce the predetermined load current and the control voltage sets the compliance voltage of the digital to analog converter to minimize current noise in the digital to analog converter.

30 Claims, 6 Drawing Sheets

LOW-NOISE PROGRAMMABLE CURRENT SOURCE

FIELD OF THE INVENTION

This invention relates to a low-noise programmable current source.

BACKGROUND OF THE INVENTION

Programmable current sources, often implemented using current mirrors, are conventionally used to control current to a number of different types of loads. For example, wideband low phase noise VCO's are required in many modern communication systems. These VCO's are often implemented as LC tuned VCO's because they provide relatively good phase noise performance. Since phase noise degrades with increased tuning sensitivity ($K_{vco}$), wideband designs are often done with a switchable bank of capacitors in parallel with the varactor. The capacitor bank splits the frequency range of the VCO into small bands. This allows the VCO to cover a large range of frequency with a small $K_{vco}$.

For optimum phase noise for a given bias current it is desirable to operate the VCO in the current-limited regime and not in the voltage-limited regime. With a wideband VCO the tank amplitude varies significantly with frequency and therefore it is desirable to have a method to control the oscillation amplitude. The amplitude of the oscillation in the current-limited regime is controlled by the bias current in the oscillator. For a fixed bias current the amplitude of oscillation in the current-limited regime increases with tank impedance which generally increases with frequency. The bias current can be digitally controlled, by replacing either the bias source or current mirror with a current source DAC. Either method allows a different bias to be selected depending on the frequency band of the VCO.

In the case where the bias source is replaced with a DAC, the vdsat of the mirror transistors will decrease with the bias current of the VCO. In the case where the mirror is replaced with a DAC, the vdsat of the transistors will remain constant with bias current.

Noise in the bias current of a VCO can be a significant source of phase noise in the oscillator. The conversion of low-frequency bias noise to phase noise in the oscillator is dependent on the transition frequency (ft) of the core transistors. Since a fixed width transistor has a lower ft with a lower bias current, the conversion of bias noise to phase noise is the worst when the bias current is lowest.

SUMMARY OF THE INVENTION

It is therefore an object of this invention to provide an improved low-noise programmable current source.

It is a further object of this invention to provide an improved low-noise programmable current source that optimizes control voltage with available headroom to minimize noise.

It is a further object of this invention to provide such an improved low-noise programmable digitally controllable current source.

It is a further object of this invention to provide such an improved low-noise programmable digitally controllable current source which uses current mirrors and/or digital to analog converter implementations.

It is a further object of this invention to provide such an improved low-noise programmable digitally controllable current source which has increased compliance with decreasing output current.

It is a further object of this invention to provide such an improved low-noise programmable digitally controllable current source which provides adjustable degeneration (e.g. resistors) with decreasing current.

It is a further object of this invention to provide such an improved low-noise programmable digitally controllable current source which provides adjustable device size with decreasing current.

The invention results from the realization that, since the headroom available for a current source driving a load increases as the current decreases, the noise can be optimally reduced by increasing the control voltage, e.g. $V_{gs}$ in an MOS current mirror to make optimal use of that headroom with a programmable current source having an output digital to analog converter for providing an output load current and a control circuit, being responsive to an input defining a predetermined load current and to the load voltage for generating a control word and a control voltage for the digital to analog converter, the control word and control voltage driving the digital to analog converter to produce the predetermined load current and the control voltage setting the compliance voltage of the digital to analog converter to substantially the load voltage to minimize current noise in the current source.

This invention features a low-noise programmable current source including an output digital to analog converter for providing an output load current and a control circuit, responsive to an input defining a predetermined load current for generating a control word and a control voltage for the digital to analog converter. The control word and control voltage drive the digital to analog converter to produce the predetermined load current and the control voltage sets the compliance voltage of the digital to analog converter to minimize current noise in the digital to analog converter.

In a preferred embodiment the control circuit may also be responsive to the load voltage. The compliance voltage may be set to substantially the load voltage. The control circuit may include the master portion of a switched current mirror. The master portion of the switched current mirror may include at least one stage and an associated switching circuit for selectively connecting/disconnecting the at least one stage. The output digital to analog converter may include a slave portion of the switched current mirror. The slave portion may include at least one stage and an associated switching circuit for selectively connecting/disconnecting the at least one stage. Each stage of the master portion may be operated simultaneously with the corresponding stage in the slave portion. The slave portion may include at least one additional stage beyond the number of stages in the master portion. The control circuit may include a current source. The current source may include a fixed current source; it may include a variable current source. The variable current source may include a digital to analog converter. The master portion of the switched current mirror may include at least one stage, each stage including a switchable degeneration resistor. The output digital to analog converter may include the slave portion of the switched current mirror. The slave portion may include at least one stage, each stage including a switchable degeneration resistor. Each stage in the master portion may be operated simultaneously with a corresponding stage in the slave portion. The slave portion may include at least one additional stage beyond the number of stages in the master portion. The control circuit may include a fixed current source or a variable current source. The variable current source may include a digital to analog converter. The master portion of the current mirror may include a fixed current source or a variable current source. The variable current source may include an input digital to analog converter. The control circuit may include a comparator responsive to the load voltage and at least the control voltage for determining whether the output analog to digital converter has more headroom than it is using. There may also be a digital state machine responsive to the comparator and the input defining a predetermined load current for generating the control word and the control voltage to adjust the compliance voltage.

The invention also features a voltage control oscillator (VCO) system having a low-noise programmable current source including an output digital to analog converter for providing an output load current to the VCO and a control circuit responsive to an input defining a predetermined load current for the VCO for generating a control word and a control voltage for the digital to analog converter. The control word and the control voltage drives the digital to analog converter to produce the predetermined load current for the VCO. The control voltage sets the compliance voltage for the digital to analog converter to minimize current noise in a digital to analog converter and phase noise in the VCO.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Figure 1:
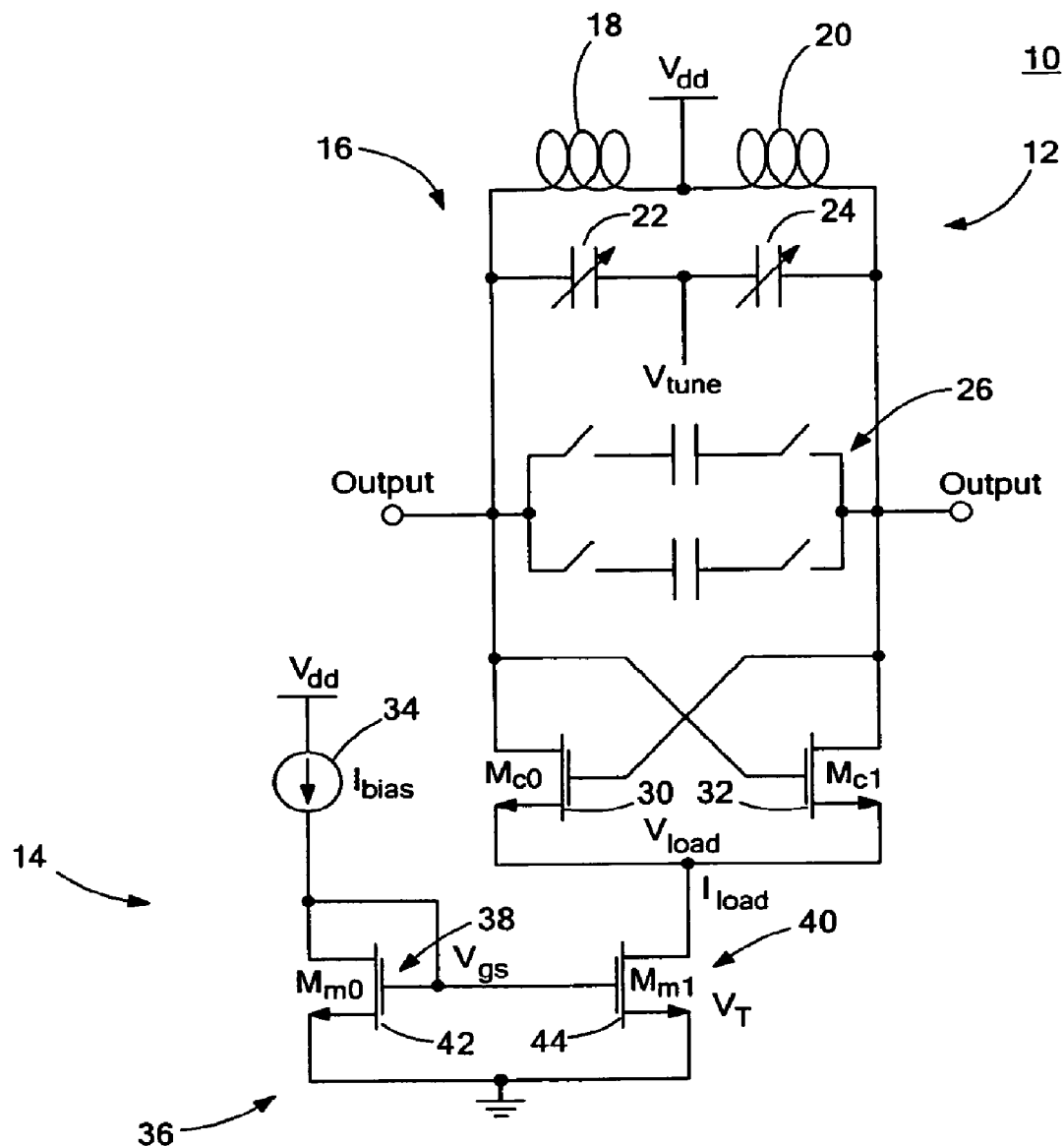
FIG. 1 is a schematic block diagram of a wideband VCO with a prior art current source using a current mirror.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings.

There is shown in FIG. 1 a wideband low-phase-noise LC voltage-controlled oscillator (VCO) system 10 including VCO circuit 12 and current source 14. VCO 12 includes an LC circuit 16 having a pair of inductors 18 and 20 and a pair of variable capacitors 22 and 24. Since phase noise degrades with increased tuning sensitivity ($K_{vco}$), wideband designs are often done with a switchable bank of capacitors 26 in parallel with varactors 22, 24 and inductors 18 and 20. This splits the frequency range of VCO 12 into small bands and allows it to cover a larger range of frequency while keeping a small $K_{vco}$. Switching transistors 30 and 32 also form a part of VCO 12. Current source 14 includes a fixed current source 34, $I_{bias}$, which is passed through current mirror 36 including a master portion 38 and slave portion 40 formed respectively of transistors 42 and 44.

Figure 2:
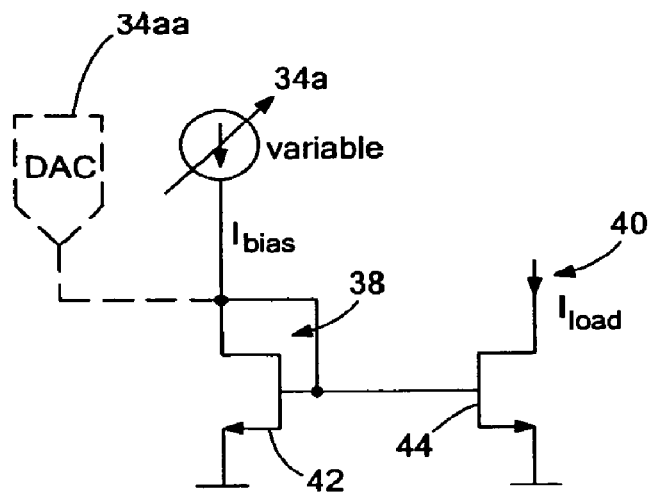
FIG. 2 is a schematic block diagram of an alternative prior art current source similar to that of FIG. 1 with a variable current source e.g. input DAC supplying the master portion of the current mirror.
Figure 3:
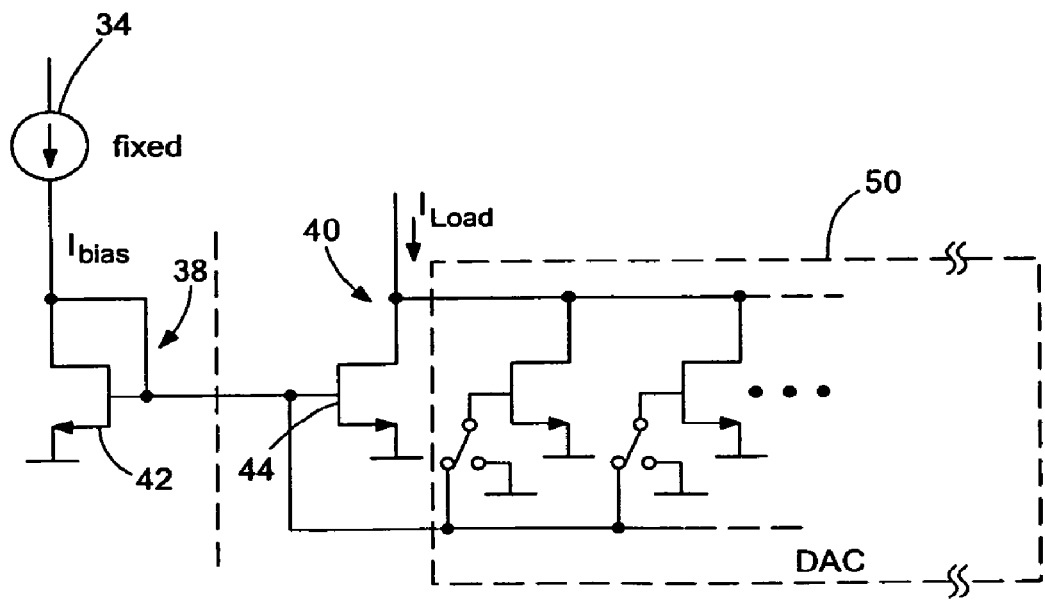
FIG. 3 is a schematic block diagram of an alternative prior art current source similar to that of FIG. 1 with the slave portion of the current mirror implemented as a part of an output DAC.
Figure 4:
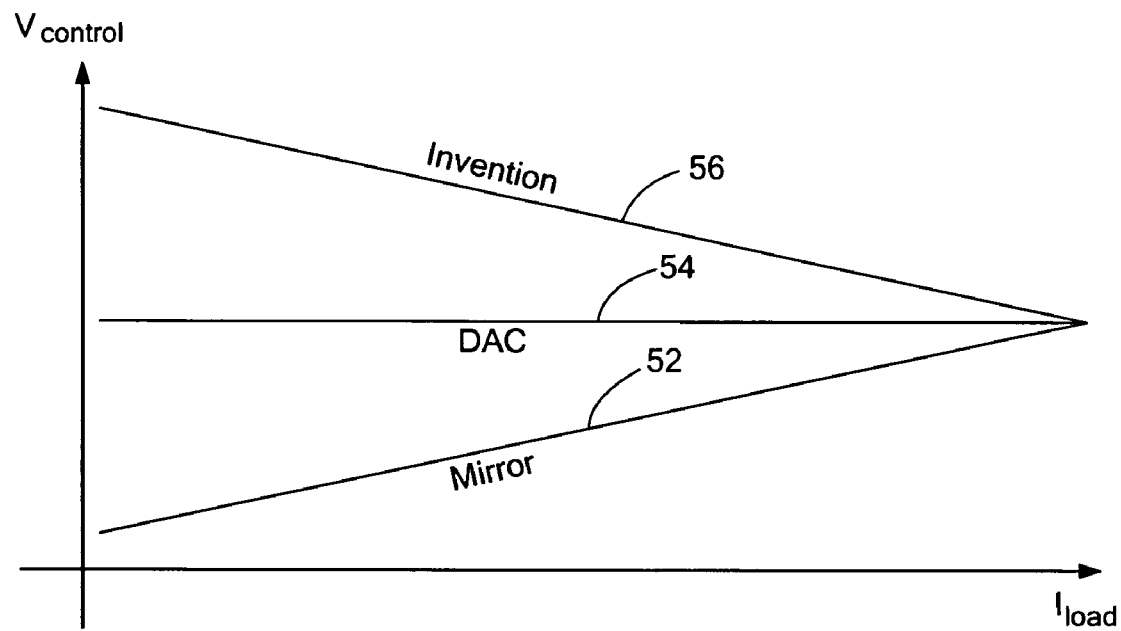
FIG. 4 illustrates the increased control voltage with decreasing load current of this invention compared to prior art DAC and current mirror devices.

To optimize phase noise for a given bias current it is desirable to operate VCO 12 in the current-limited regime not the voltage-limited regime. With the wideband VCO 12 the tank amplitude, that is the peak voltage across the LC circuit comprised of elements 18, 20, 22 and 24, varies significantly with frequency; therefore it is desirable to have a way to control the oscillation amplitude. The amplitude of the oscillation in the current-limited regime is controlled by the bias current in the oscillator which is ultimately supplied by the bias current source 34 of current source 14. For a fixed bias current the amplitude of the oscillation in the current limited regime generally increases with frequency. The bias current can be digitally controlled by replacing the fixed current source 34 with a variable current source 34a, FIG. 2, or input DAC 34aa. Alternatively, as shown in FIG. 3, current source 34 may remain fixed but slave portion 40 of the transistor mirror 44 may be implemented as a part of output DAC 50, FIG. 3. In the case where the bias source 34 is replaced with a variable source 34a, 34aa, FIG. 2, the $V_{dsat}$ of mirror transistors 42 and 44 will decrease with the bias current of VCO 12 as indicated at 52, FIG. 4. In the case where the slave portion 40 of the mirror is replaced with an output DAC 50 FIG. 3 the $V_{dsat}$ of those transistors will remain constant with the bias current of VCO 12 as indicated at 54, FIG. 4.

This invention is based on a realization that if the bias current is adjusted so that the oscillation amplitude is approximately constant across all frequency bands, then the available voltage headroom for the current source increases as the bias in the core transistors 30, 32, FIG. 1, decreases.

Figure 5:
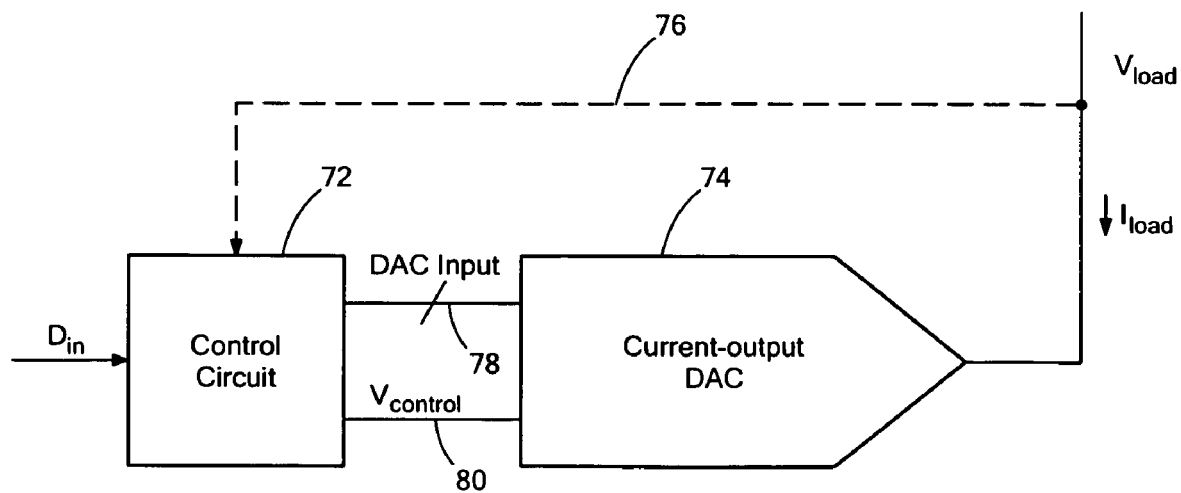
FIG. 5 is a schematic block diagram of a low-noise programmable current source according to this invention.

The available headroom is increased due to the decreased $V_{gs}$ (where $V_{gs}$ is generally the control voltage and specifically with respect to the MOS transistors shown in FIG. I it is the gate to source voltage) for those core transistors 30, 32, this extra headroom can be used to reduce the noise of the bias current source. Since the headroom available for the current source increases as the current decreases as indicated at 56 in FIG. 4, it is possible to lower the noise of the bias current source as the current decreases. Thus, the bias noise can be lowered when it is most critical to do so. A low-noise current source 70, FIG. 5, according to this invention includes a control circuit 72 and current output DAC 74. $D_{in}$ is the digital input which specifies the predetermined load current $I_{load}$. Control circuit 72 responds to the digital input $D_{in}$ and the load voltage $V_{load}$ on line 76 to produce a control word DAC input 78 and a control voltage 80 which is the counterpart of $V_{gs}$ in the current-output DAC. Alternatively, control circuit 72 responds to the digital input $D_{in}$ to produce control word 78 and control voltage 80 based on the expected load voltage associated with the desired load current. This simpler approach is possible when the variation of load voltage with load current is known at the time control circuit 72 is designed. Control circuit 72 generates the control word, the DAC input on line 78, and the control voltage on line 80 to enable digital to analog converter 74 to produce the predetermined load current requested by the digital input $D_{in}$. The control voltage 80 also sets the compliance voltage of DAC 74 so that it is substantially equal to the load voltage $V_{load}$ to minimize the current noise in a digital to analog converter. Compliance voltage is the minimum voltage of the DAC at which the current source can operate properly.

It can be seen that in FIG. 1 for the device Mm1, 40 to behave like a current source $V_{load}$ must be $\geq V_{gs}$ minus $V_T$ where $V_T$ is the intrinsic threshold voltage of the Mm1 MOS transistor. As the load current goes down and the load voltage goes up, the headroom for $V_{gs}$ goes up as well. Since noise is an inverse function of $V_{gs}$ $$\text{noise} = \frac{16kT}{3} * \frac{I_{load}}{(V_{gs} - V_T)} \quad (1)$$

making $V_{gs}$ as large as possible reduces the noise. It is therefore understood according to this invention, that making $V_{gs}$ equal to the full value Of $V_{load}$ plus $V_T$ reduces the noise to the maximum extent. Further $V_{gs}$ is a function of the physical dimensions of the MOS transistor $$V_{gs} = V_T + \sqrt{\frac{I_{bias}}{\mu(W/L)}} \quad (2)$$

where W and L are the dimensions of the MOS transistor. Therefore by decreasing W $V_{gs}$ is increased and the noise is decreased. By decreasing W sufficiently so that the $V_{gs}$ reaches its maximum, namely, $V_{load}$ plus $V_T$, the maximum noise suppression can be obtained.

Figure 6:
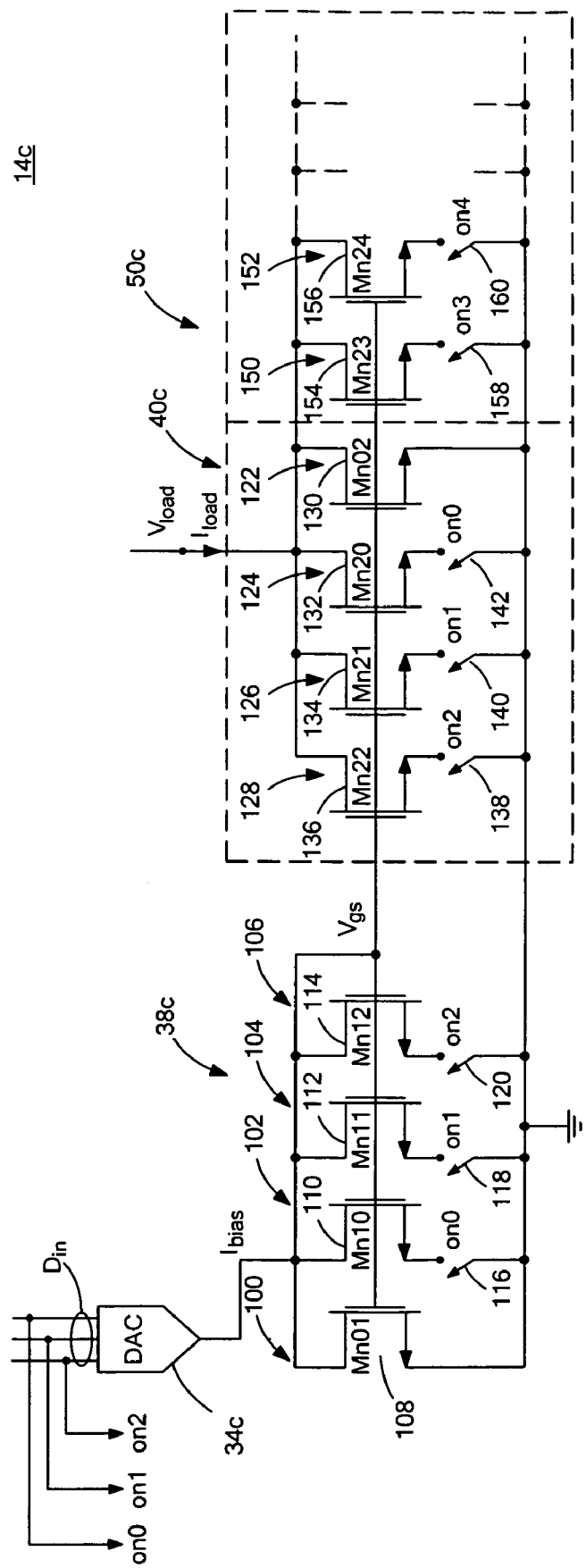
FIG. 6 is a more detailed schematic block diagram of the low-noise current source of FIG. 5 for an anticipated load voltage using switched device size.

In one embodiment current source 34c, FIG. 6, includes a DAC and master portion 38c includes a number of stages 100, 102, 104 and 106. Stage 100 includes transistor 108. Each of stages 102, 104 and 106 include a transistor 110, 112 and 114 and a switch 116, 118 and 120, respectively. Each of these transistors may have the same area, current density, or they may be different. Slave portion 40c also includes a plurality of stages 122, 124, 126 and 128. Each of the stages 122-128 includes a transistor 130, 132, 134 and 136, respectively. Stages 124-128 also include switches 138, 140 and 142. Digital word $D_{in}$ arrives at the input of DAC 34c, defines the desired load current $I_{load}$ and sounds the digital outputs $ON_0$, $ON_1$, $ON_2$ to set switches 116, 118, 120 accordingly. This, for example, keeps or subtracts more or less of the size or width of the transistors 110, 112 and 114 and thereby adjusts the value of $V_{gs}$. Transistors 122-128 may be equal in size to each other or different and may have the same areas as their counterpart transistors 108-114 or they may be ratioed. For example, all of the areas of the transistors in slave portion 40c may be twice or three times or four times the area of their counterpart transistors in master portion 38c. Stages 122-128 may be implemented as a part of digital to analog converter 50c which may include additional stages 150, 152 . . . having transistors 154, 156 with switches 158 and 160.

Figure 7:
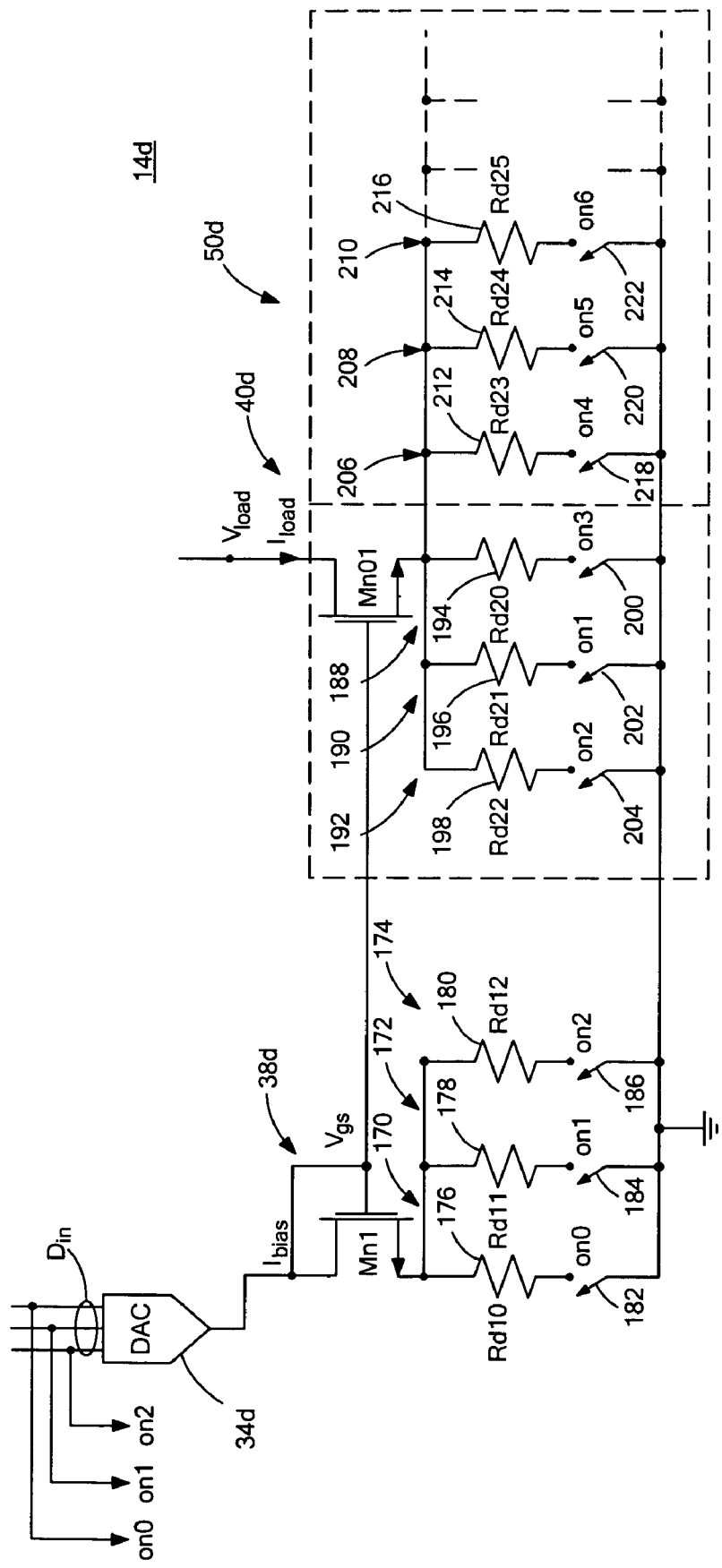
FIG. 7 is a more detailed schematic block diagram of the low-noise current source of FIG. 5 for an anticipated load voltage using switched device degeneration.

In another implementation, FIG. 7, master portion 38d includes a number of stages 170, 172, 174 including degeneration resistors 176, 178, 180 controlled by switches 182, 184, 186, respectively. Resistors 176-180 may be equal to each other or different from each other. Slave portion 40d also includes a number of stages 188, 190, 192 formed of degeneration resistors 194, 196, 198 and associated switches 200, 202, 204. Degeneration resistors 194-198 may be equal to each other or different from each other in resistance and they may be equal to or ratioed with respect to their corresponding degeneration resistor counterparts 176, 178, 180 in master portion 38d. Again the switches 182-186, 200-204 are operated by the digital input word $D_{in}$ submitted to DAC 34d using switch signals $ON_0$, $ON_1$, $ON_2$. Stages 188, 190, 192 may be formed as part of output digital to analog converter 50d which may include additional stages 206, 208, 210 each having a degeneration resistor with associated switches 218, 220, and 222.

The transistors in FIG. 6 are shown as MOS transistors. Their accompanying switches may also be implemented as MOS transistors. But the invention is not limited to MOS transistors. For example, the implementation of FIG. 7 can use either MOS transistors or bipolar junction transistors for the master and slave devices Mn1 and Mn2. Further, although all of the MOS transistors shown have been NMOS transistors and the disclosed current source has acted as a current sink, the transistors could be PMOS transistors in which case the voltages would be inverted and the current source would act to supply current, all of which is well known and within the skill of the art. It should also be understood that the switches in FIGS. 6 and 7 can be operated not simply to connect one, two, three or all but can use different combinations of different valued transistors or resistors. There could be any number of combinations. For example, similar combinations could be accomplished with the resistor or transistor areas being unequal for even more versatility. For example, having transistors with three different areas a, b and c the combinations could be a, b, c, ab, ac, bc, abc.

Figure 8:
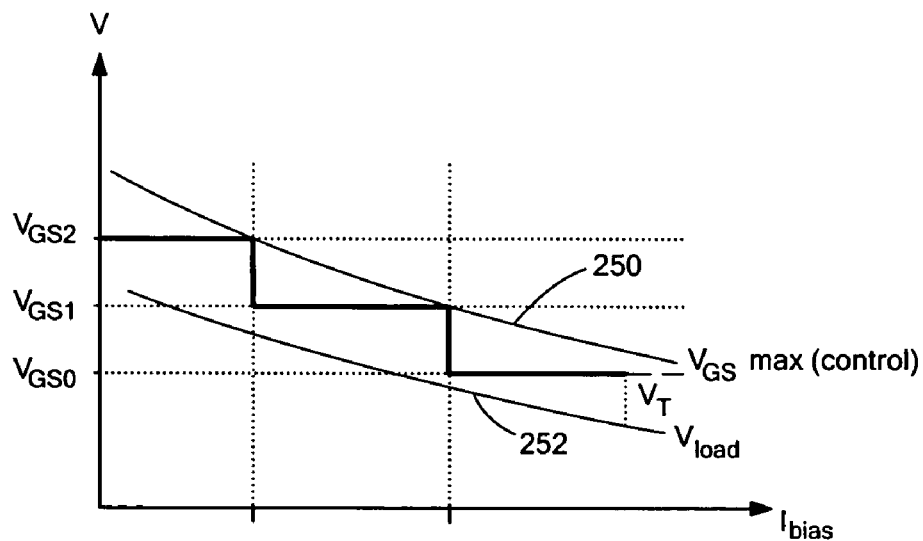
FIG. 8 illustrates the optimizing of the control voltage e.g. $V_{gs}$ with the available headroom as the load voltage increases with decreasingly load current.
Figure 9:
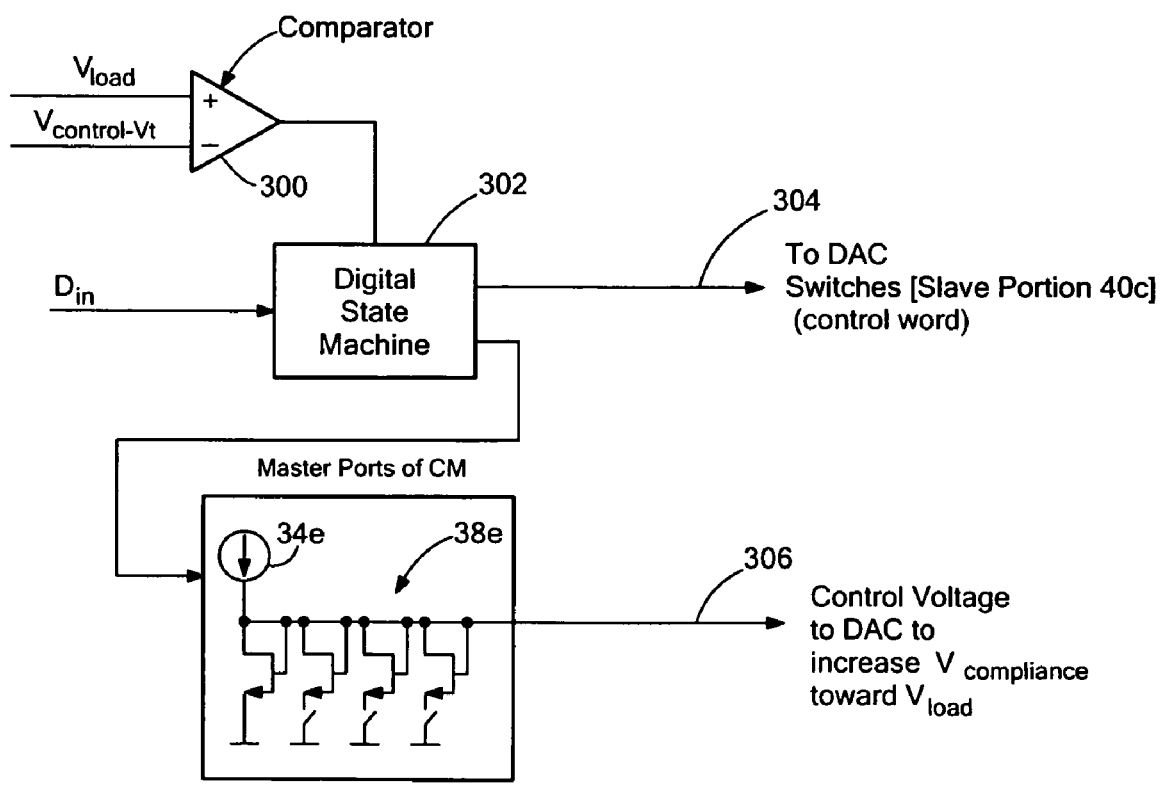
FIG. 9 is a schematic block diagram of the control circuit of FIG. 5 for monitoring a measured load voltage.

A simplified illustration of the manner in which this invention allows the $V_{gs}$ to use the maximum headroom is shown in FIG. 8 where the $V_{gs}$, max, 250, is seen spaced above and generally parallel to the load voltage 252. As a simple example, input word $D_{in}$ could select but three $V_{gs}$ voltages $V_{gs0}$, $V_{gs1}$, $V_{gs2}$ which would optimize step wise the use of the headroom by $V_{gs}$ or $V_{(control)}$. Were more $V_{gs}$ steps to be selected the headroom would be used more efficiently. While thus far the disclosure has been of a current source which anticipates $V_{load}$ based on the desired load current and the circuit connected to the current source this is not a necessary limitation of the invention. In FIG. 9 which employs a comparator 300, digital state machine 302, and the master portion 38e of the current mirror. Comparator 300 looks at the load voltage $V_{load}$ and the control voltage $V_{gs}$ minus the intrinsic voltage, for example, $V_T$ the threshold voltage of the transistor. If the DAC has more headroom than it is using comparator 300 puts out a high signal to digital state machine 302. It then passes the control word $D_{in}$ on line 304 to the switches in the slave portion 40c which as shown, may be a part of an output digital to analog converter. This is the control word. Digital state machine 302 also delivers an output to the master portion 38e of the current mirror which delivers on line 306 the control voltage to the output DAC to increase the $V_{(compliance)}$ towards $V_{load}$.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims:

What is claimed is:

1. A low-noise programmable current source comprising;
   an output digital to analog converter for providing an output load current; and a control circuit, responsive to an input defining a predetermined load current, for generating for said digital to analog converter, a control word and a control voltage, said control word and control voltage driving said digital to analog converter to produce said predetermined load current and said control voltage setting the compliance voltage of said digital to analog converter to minimize current noise in said digital to analog converter.

2. The low-noise programmable current source of claim 1 in which said control circuit is also responsive to a load voltage.

3. The low-noise programmable current source of claim 2 in which said control circuit sets the compliance voltage to substantially said load voltage.

4. The low-noise programmable current source of claim 1 in which said control circuit includes a master portion of a switched current mirror.

5. The low-noise programmable current source of claim 4 in which said master portion of said switched current mirror includes at least one stage and an associated switching circuit for selectively connecting/disconnecting said at least one stage.

6. The low-noise programmable current source of claim 5 in which said output digital to analog converter includes a slave portion of said switched current mirror.

7. The low-noise programmable current source of claim 6 in which said slave portion includes at least one stage and an associated switching circuit for selectively connecting/disconnecting said at least one stage.

8. The low-noise programmable current source of claim 7 in each said stage in said master portion is operated simultaneously with a corresponding stage in said slave portion.

9. The low-noise programmable current source of claim 6 in which said slave portion includes at least one additional stage beyond the number of stages in said master portion.

10. The low-noise programmable current source of claim 4 in which said current source includes a fixed current source.

11. The low-noise programmable current source of claim 4 in which said current source includes a variable current source.

12. The low-noise programmable current source of claim 11 in which said variable current source includes a digital to analog converter.

13. The low-noise programmable current source of claim 11 in which said control circuit includes a master portion of a switched current mirror.

14. The low-noise programmable current source of claim 13 in which said master portion of said switched current mirror includes at least one stage each stage including a switchable degeneration resistor.

15. The low-noise programmable current source of claim 14 in which said output digital to analog converter includes a slave portion of said switched current mirror.

16. The low-noise programmable current source of claim 15 in which said slave portion includes at least one stage, each stage including a switchable degeneration resistor.

17. The low-noise programmable current source of claim 16 in which each said stage in said master portion is operated simultaneously with a corresponding stage in said slave portion.

18. The low-noise programmable current source of claim 15 in which said slave portion includes at least one additional stage beyond the number of stages in said master portion.

19. The low-noise programmable current source of claim 13 in which said control circuit includes a fixed current source.

20. The low-noise programmable current source of claim 13 in which said control circuit includes a variable current source.

21. The low-noise programmable current source of claim 20 in which said variable current source includes a digital to analog converter.

22. The low-noise programmable current source of claim 4 in which said master portion of said current source includes a fixed current source.

23. The low-noise programmable current source of claim 4 in which said master portion of said current source includes a variable current source.

24. The low-noise programmable current source of claim 23 in which said variable current source includes an input digital to analog converter.

25. The low-noise programmable current source of claim 16 in which said master portion of said current source includes a fixed current source.

26. The low-noise programmable current source of claim 16 in which said master portion of said current source includes a variable current source.

27. The low-noise programmable current source of claim 16 in which said variable current source includes an input digital to analog converter.

28. The low-noise programmable current source of claim 2 in which said control circuit includes a comparator responsive to said load voltage and at least said control voltage for determining whether said output digital to analog converter has more headroom than it is using, a digital state machine responsive to said comparator and said input defining a predetermined load current for generating said control word and said control voltage to adjust said compliance voltage.

29. A voltage controlled oscillator (VCO) system having a low-noise programmable current source comprising:
an output digital to analog converter for providing an output load current to the VCO; and
a control circuit responsive to an input defining a predetermined load current for the VCO for generating, for the digital to analog converter, a control word and a control voltage, said control word and control voltage driving said digital to analog converter to produce said predetermined load current for said VCO, said control voltage setting the compliance voltage of said digital to analog converter to substantially minimize current noise in the digital to analog Converter and phase noise in the VCO.

30. A low-noise programmable current source comprising;
an output digital to analog converter for providing an output load current; and
a control circuit, responsive to a load voltage and an input defining a predetermined load current, for generating for said digital to analog converter, a control word and a control voltage, said control word and control voltage driving said digital to analog converter to produce said predetermined load current and said control voltage setting the compliance voltage of said digital to analog converter to minimize current noise in said digital to analog converter, said control circuit including a comparator responsive to said load voltage and at least said control voltage for determining whether said output digital to analog converter has more headroom than it is using, a digital state machine responsive to said comparator and said input defining a predetermined load current for generating said control word and said control voltage to adjust said compliance voltage.

* * * * *